United States Patent
Dangel et al.

(10) Patent No.: US 7,523,547 B2
(45) Date of Patent: Apr. 28, 2009

(54) METHOD FOR ATTACHING A FLEXIBLE STRUCTURE TO A DEVICE AND A DEVICE HAVING A FLEXIBLE STRUCTURE

(75) Inventors: Roger Dangel, Zug (CH); Laurent Dellmann, Ruschlikon (CH); Michel Despont, Au (CH); Bert Jan Offrein, Schoenenberg (CH); Stefano Sergio Oggioni, Brianza (IT)

(73) Assignee: International Business Machines Corporation, Armonk, NY (US)

( * ) Notice: Subject to any disclaimer, the term of this patent is extended or adjusted under 35 U.S.C. 154(b) by 420 days.

(21) Appl. No.: 11/469,336

(22) Filed: Aug. 31, 2006

(65) Prior Publication Data

US 2007/0205479 A1    Sep. 6, 2007

(30) Foreign Application Priority Data

Aug. 31, 2005   (EP)   ................... 05405501

(51) Int. Cl.
*H01R 9/00*      (2006.01)
*H05K 3/00*      (2006.01)

(52) U.S. Cl. ............................. 29/842; 29/832; 174/260
(58) Field of Classification Search ................. 174/260; 29/832–833, 842–845
See application file for complete search history.

(56) References Cited

U.S. PATENT DOCUMENTS

| | | | |
|---|---|---|---|
| 6,229,712 B1* | 5/2001 | Munoz-Bustamante et al. | 361/783 |
| 7,124,931 B2* | 10/2006 | Lewis et al. | 228/180.22 |
| 7,171,745 B2* | 2/2007 | Mostafazadeh et al. | 29/832 |
| 2002/0003459 A1* | 1/2002 | Yatsuda et al. | 333/193 |

* cited by examiner

*Primary Examiner*—Jeremy C Norris
(74) *Attorney, Agent, or Firm*—Ido Tuchman; Kenneth R. Corsello

(57) ABSTRACT

Techniques for producing a flexible structure attached to a device. One embodiment includes the steps of providing a first substrate, providing a second substrate with a releasably attached flexible structure, providing a bonding layer on at least one of the first substrate and the flexible structure, adjoining the first and second substrate such that the flexible structure is attached at the first substrate by means of the bonding layer, and detaching the second substrate in such a way that the flexible structure remains on the first substrate.

1 Claim, 8 Drawing Sheets

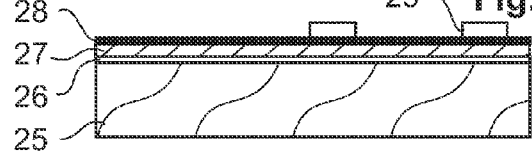
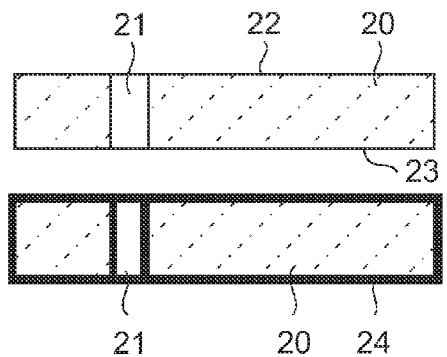
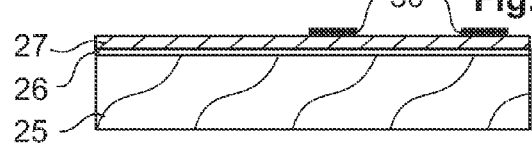
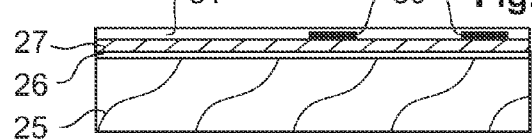
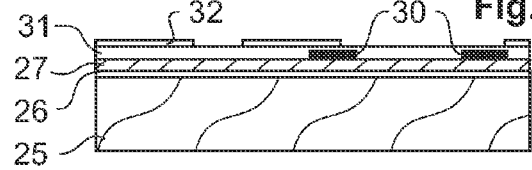
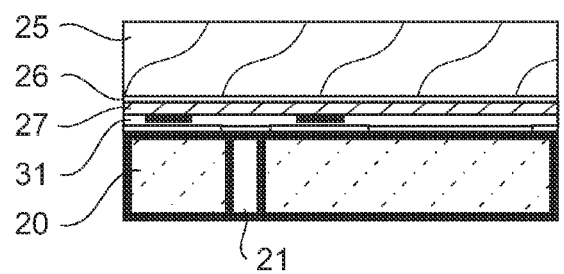
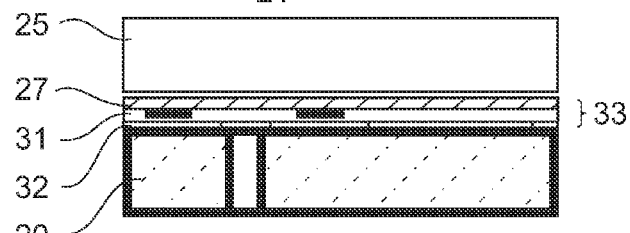
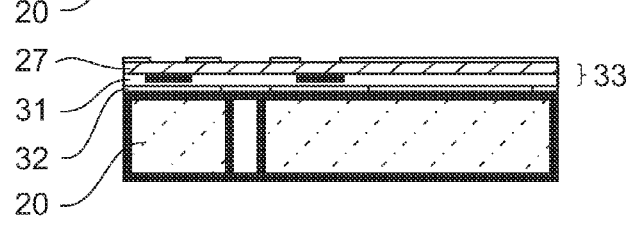

METHOD FOR ATTACHING A FLEXIBLE STRUCTURE TO A DEVICE AND A DEVICE HAVING A FLEXIBLE STRUCTURE

CROSS-REFERENCE TO RELATED APPLICATIONS

This application claims priority under 35 U.S.C. § 119 to European Patent Application No. 05405501.7 filed Aug. 31, 2005, the entire text of which is specifically incorporated by reference herein.

BACKGROUND OF THE INVENTION

The present invention relates to a method for attaching a flexible structure to a device. The present invention further relates to a method for producing an electro-optical device being connectable by means of a flexible structure. Furthermore, the present invention relates to a method for producing a flexible connector. Furthermore, the present invention relates to an electro-optical device and to a flexible connector.

Flexible interconnection elements such as flexible cables (flexible cables) are widely used primarily in order to establish electrical connections. They comprise a stack of flexible polymer-based materials, e.g. polyimide, and embedded metal structures to provide the electrical connection (electrical flexible). Flexible cables may also be used for optical connections (optical flexible) and/or for a flexible mechanical connection (mechanical flexible).

The realization of electrical, electro-optical or microelectro-mechanical (MEMS) type of components is based on integrated circuit (IC) compatible wafer level processes such as silicon technology. Such processes are well developed and standardized and serve as a cost-effective means for fabricating small, micro- and nano-devices. The introduction of flexible structures which provide an interconnection with the devices is required for several applications.

In order to provide a flexible interconnection element connected to a device, such as a bare chip, it is attached to a device which usually has been fabricated by means of applying wafer level processes on a substrate. The techniques for fabricating such a device are based on a bottom-up process flow where layers are subsequently deposited and patterned. The wafer surface is required to be flat or at least existing corrugations should be small with respect to the feature size that has to be realized in the next processing step.

To realize a flexible interconnection element on such a device, further wafer level process steps are required. These further process steps may require a plane surface, the utilization of chemicals and/or the appliance of temperatures which do not affect the structures of the device fabricated prior thereto. In other words, the process steps for fabricating the flexible interconnection element may have to be compatible to the surface unevenness and to the preceding wafer-level-processes for fabricating the integrated device. Furthermore, by applying the flexible interconnection element to an integrated device by means of wafer level processes on the substrate of the integrated device, it is difficult to partly release the flexible interconnection structure from the device surface by means of a wafer-level process which is necessary to provide a flexible interconnection between the device and an external environment.

BRIEF SUMMARY OF THE INVENTION

According to a first aspect of the present invention a method for producing a flexible structure attached to a device is provided. The method comprises the steps of providing a first substrate; providing a second substrate; providing a flexible structure the second substrate, so that the flexible structure is releasably attached to the second substrate; providing a bonding layer on at least one of the first substrate and the flexible structure; adjoining the first and second substrate such that the flexible structure is attached on the first substrate by means of the bonding layer; and detaching the second substrate in such a way that the flexible structure remains on the first substrate. The first substrate can be a processed substrate. A processed substrate includes at least one functional element or a structural pattern. Such structural elements can be electrical elements like resistors, capacities, transistors, memory cells, electrooptical elements, sensors, wires, antennas, a processor, logic elements, etc.

The method of the present invention provides an improved way to provide a flexible structure at a device substrate thereby less affecting device structures due to surface evenness, or thermal and material incompatibilities the substrate. These advantages become even more substantial in connection with a processed substrate, e.g. a pre-processed substrate comprising one or more devices.

Preferably, the bonding layer is structured to define a first region in which the flexible structure is attached on the first substrate and a second region in which the flexible structure is uncoupled from the first substrate.

In a further embodiment, the first substrate is removed in the second region such that the flexible structure extends beyond the remaining first region.

It can be further provided that a sacrificial layer is provided between the second substrate and the flexible structure wherein the detaching of the second substrate is performed by degrading the sacrificial layer.

Advantageously, the sacrificial layer is adapted such that the detachment of the flexible structure and the second substrate is released by applying light through the second substrate to the sacrificial layer.

Preferably, the second substrate is transparent for the wavelength of the light applied to release the second substrate.

According to a preferred embodiment alignment elements are provided on the first and second substrate arranged in such a way that the first and second substrate are alignable by means of the alignment elements.

The bonding layer may comprise a polymer having a lower glass transition temperature than each of the materials of the first and second substrates and of the flexible structure. Preferably, the thermal expansion coefficients of the first and second substrate are substantially equal.

Furthermore, the flexible structure can be provided including an interconnection element as at least one of an optical, a mechanical and an electrical interconnection element.

The step of providing the flexible structure may comprise the steps of providing a first flexible layer on the second substrate; providing the interconnection element on the first flexible layer; and providing a second flexible layer to cover the first flexible layer and the interconnection element.

It can further be provided that a further interconnection element is provided on the second flexible layer and that a third layer is provided to cover the second flexible layer and the interconnection element. Thereby, a multi-layer flexible structure can be made.

Preferably, at least one of the materials of the first layer, the second layer and the third layer is selected from a group consisting of a BCB polymer, a polyimide and a LCP (liquid crystal polymer).

The interconnection element may be provided as an electrical conducting element, wherein the flexible structure is patterned to uncover the interconnection element at least in a contact region, wherein the contact region is filled with a conducting material to provide a contact element on the flexible structure.

According to another aspect of the present invention a method for producing an electro-optical device is provided comprising the steps of providing a via in a first substrate; performing the method for producing a flexible structure attached to the first substrate as mentioned above; and connecting an optoelectronic element to the interconnection element of the flexible structure by means of a contact element, wherein the optoelectronic element is arranged that light is either sent through the via, light is received through the via, or both.

Preferably, the bonding layer and the flexible structure each comprise an aperture wherein the first and the second substrates are adjoined such that the aperture is aligned with the via in the second substrate.

The via and the aperture may be filled with a transparent filling material which comes in contact with the optoelectronic element.

According to a preferred embodiment the filling material is filled such that a surface of the first substrate opposing the surface on which the flexible structure is arranged, and the filling material in the via form a plane.

According to another aspect of the present invention a method for producing a flexible connector is provided comprising the steps of performing the method for producing a flexible structure as mentioned above; wherein the first substrate is provided such that a first and a second area of the first substrate are defined, wherein the step of adjoining is performed such that the flexible structure is provided to bridge the first and the second area; wherein the first and second area are separated from the first substrate to obtain a first and a second plug connected by the flexible structure to provide the flexible connector.

Preferably, the first and second areas are separated such that the flexible structure has an end which is in one plane with a front surface of the separated first and second area, respectively.

It may further be provided the steps of providing a groove in at least one of the first and second area, and inserting a guide pin into the groove.

Advantageously, an encapsulation layer is provided on the first and the second plug, also referred to as connector end.

The guide pin may be inserted so that the guide pin extends beyond the front surface of the first and second plug. The guide pin may further be pulled out to form a guide cavity.

It can be provided that the first substrate includes a spacing region between the first and the second area wherein the material of the first substrate is removed.

According to another aspect of the present invention a device is provided. The device comprises a processed substrate and a flexible structure comprising a flexible material, and preferably including an interconnection element to provide at least one of an electrical and optical interconnection. A structured bonding layer between the substrate and the flexible structure is further provided, wherein the flexible structure extends beyond the substrate to preferably provide the one of the electrical and optical interconnection.

Preferably, first and second plugs are provided at the substrate, which are separated and which are connected by the flexible structure.

The flexible structure and at least one of the first and second plugs may comprise a common plane front surface.

Furthermore, on at least one of the first and second connector ends an encapsulation structure may be arranged.

In at least one of the first and second connector ends a guide pin may be arranged which protrudes from the common front surface.

Furthermore, in at least one of the first and second connector ends a guide aperture is arranged which extends from the common plane front surface.

Preferably, a via is arranged through the substrate and the flexible structure, wherein the flexible structure comprises a contact element, wherein an optoelectronic element is arranged on the flexible structure such that the optoelectronic element is in contact with the contact element, wherein the optoelectronic element is directed that light is either transmitted through the via, received through the via, or both. The via may be filled with a transparent material to guide the light beam to the optoelectronic element.

Furthermore, the flexible structure may comprise further contact elements which are contacted by a further device, wherein the further device comprises at least one of a driver and an amplifier circuit.

BRIEF DESCRIPTION OF THE SEVERAL VIEWS OF THE DRAWINGS

Preferred embodiments of the present invention are discussed in detail in the following description with regard to the accompanying drawings in which.

DETAILED DESCRIPTION OF THE INVENTION

The present invention beneficially includes a method for attaching a flexible interconnection element on a device. The method can be carried out more easily and which reduces the aforementioned disadvantages in the prior art. Particularly, the present invention provides a method for attaching a flexible interconnection element on a device less affecting the functionality and the structures fabricated on the device in preceding wafer level process steps.

FIGS. 1a to 1h illustrate exemplary process states of a method for attaching a flexible interconnection element to a device such as a bare chip. According to FIG. 1a, a first substrate 1 is provided having an upper surface 2 which is processed by wafer level process steps as known in silicon technology. Preferably, the first substrate 1 can comprise silicon, however, it is also possible to select another material for the substrate 1 which is suitable to provide the desired functionality.

Figure 1A:
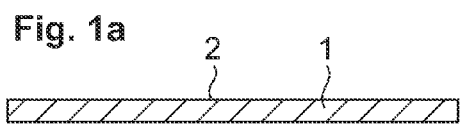
FIGS. 1a to 1h illustrate the process states of a method for attaching a flexible interconnection element to a device such as a bare chip.
Figure 1C:
Figure 1B:

In the process state shown in FIG. 1b, the upper surface 2 of the first substrate 1 has been processed such that the upper surface 2 now includes at least one of a functional element 4 and a structural pattern 3. The functional element 4 may comprise an electronic circuit, an optoelectronic element or the like. The structural pattern 3 is exemplarily illustrated in FIG. 1b in the form of grooves. For further explanation of the method, it is presumed that in the first substrate 1 the functional element 4 is integrated as an integrated circuit.

The integrated circuit comprises contact pads (not shown) by which the integrated circuit can be electrically connected to an external environment. Usually, the surface of the processed integrated circuit is not flat so that a further processing to provide a flexible element cannot reliably be performed, the functional element included in the first substrate 1 may further be sensitive to the appliance of some agents and/or heating processes such that a provision of a flexible interconnection element by a continued wafer level processing of the first substrate 1 would not be appropriate.

As shown in FIG. 1c, a second substrate, also referred to as carrier substrate 5 is provided which in the described embodiment is a glass wafer of the same size as the first substrate 1. However, the size of the carrier substrate 5 can be larger or smaller than the size of the substrate 1. The carrier substrate 5 is subsequently processed and fabricated as shown and described below in more detail with respect to FIGS. 2c to 2g. The fabrication of the flexible interconnection element 6 on the carrier substrate 5 is carried out in a way that it can be separated from the carrier substrate 5 again. The interconnection element 6 is formed as a shaped layer on the carrier substrate 5 inside which preferably at least one of electrical and optical signal lines 11, also referred to as electrical interconnection element, for the electrical or optical transmission of signals are embedded. One possible material for electrical signal lines may be copper or other conductive materials. The flexible interconnection element 6 comprises a flexible material such as a polymer e.g. BCB or the like, which provides a flexibility to be used as a flexible interconnection cable which can be bent and formed to connect the integrated circuit 4 with a predefined location of an external environment.

On the upper surface of the flexible interconnection element 6, a bonding layer 7 is applied and afterwards patterned so that in a first region 8 the bonding layer 7 is provided and removed in a second region 9.

Figure 1D:
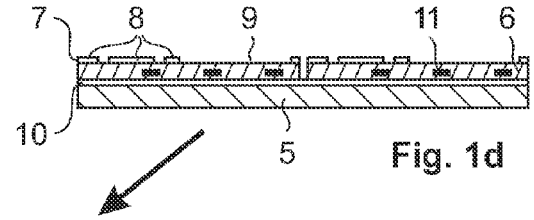
Figure 1E:
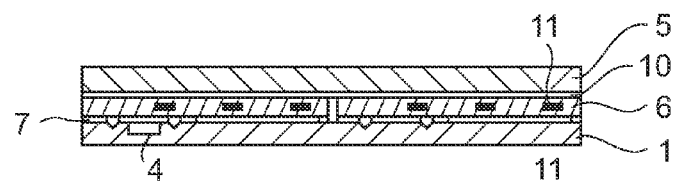

As shown in FIG. 1e, the structure of FIG. 1d is turned upside down and put on the structured substrate 1 in an aligned manner so that the first region 8 of the bonding layer 7 is brought into contact with the upper surface 2 of the first substrate 1. In an alternative embodiment, the bonding layer 7 can otherwise be applied on the upper surface 2 of the first substrate 1 and be patterned such that after sandwiching the first substrate 1 and the second substrate 5 the bonding layer 7 is in contact with the flexible interconnection element 6. By applying a heating process, the structure of FIG. 1d and the first substrate 1 are bonded to each other in such a way that the flexible interconnection element 6 is fixed to the first substrate 1.

The material of the bonding layer 7 can preferably comprise a glue or a polymer material having a sufficiently low glass transition temperature TG, preferably lower than each of the materials of the first substrate 1, the second substrate 5 and the flexible interconnection element 6. A preferred temperature herefore is e.g. less than 300° C. The material of the bonding layer 7 is preferably selected to achieve a bonding effect by applying a heating process without denaturalizing the polymers and other materials included in the composed structure of FIG. 1e. It is also preferred for the thermal expansion coefficients of the first substrate 1 and second substrate 5 to be substantially equal.

Figure 1F:
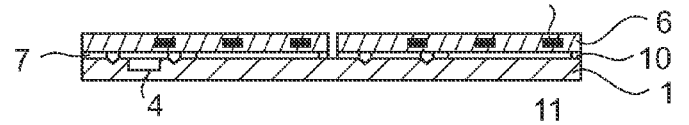

As shown in FIG. 1f, the next process step concerns the removal of the carrier substrate 5. In the shown embodiment, the carrier substrate 5 is connected to the flexible interconnection element 6 by means of a sacrificial layer 10 which is irradiated in a manner to degrade the sacrificial layer 10. In the given embodiment, the carrier substrate 5 is a glass substrate transparent to UV light of a predetermined wavelength and the sacrificial layer 10 includes material such as a polyimide which is sensitive to the respective predetermined wavelength of the UV light. From the outer surface of the carrier substrate 5, a UV light radiation is directed to the sacrificial layer 10 beneath the glass substrate 5 by means of a laser unit so that the sacrificial layer 10 absorbs the UV light and is thus heated. The heating degrades the sacrificial layer 10 in such a way that the linkage between the carrier substrate 5 and the surface of the flexible interconnection element 6 is broken. Thus, the carrier substrate 5 can be released from the flexible interconnection element 6 and the carrier substrate 5 can finally be lifted off. The remaining structure which is depicted in FIG. 1f comprises the substrate 1 on which the flexible interconnection element 6 is selectively connected by the previously patterned bonding layer 7.

Figure 1G:
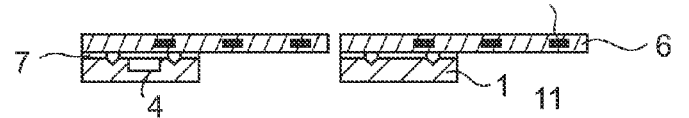

Thereafter, as shown in the process state of FIG. 1g, the number of devices on the first substrate 1 are separated from each other whereby a portion of the first substrate 1, on which the flexible interconnection element 6 is not bonded by a first region 8 of the bonding layer 7, is also removed. The portion of the first substrate 1 that is removed is thereafter referred to as the sacrificial substrate portion. The sacrificial substrate portion is removed e.g. by an etch process or by a dicing process, wherein the etching and/or the dicing does not or only negligibly affect the flexible interconnection element 6.

Figure 1H:
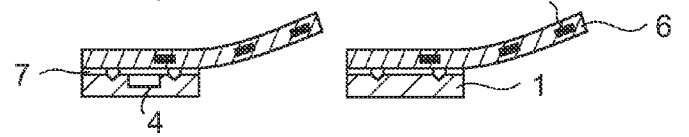

As illustrated in FIG. 1h, a device is obtained on which a flexible interconnection element 6 is attached and extends therefrom which provides a flexible interconnection to the electronic circuits on the device.

The electrical connecting of the signal lines included in the flexible interconnection element 6 with the contact pads of the integrated circuit 4 in the substrate 1 can be selectively performed preferably after the process state shown in FIG. 1f. Therefore, a trench structure (not shown) is provided in the flexible interconnection element 6 at a location at which the signal line and the contact pad are arranged on top of each other with respect to the upper surface 2 of the substrate 1. The trench structure is adapted to extend up to the contact pad through the interconnection element 6 whereafter the trench is filled with an electrically conductive material to provide a connection between the contact pad and the signal line.

Figure 2K:
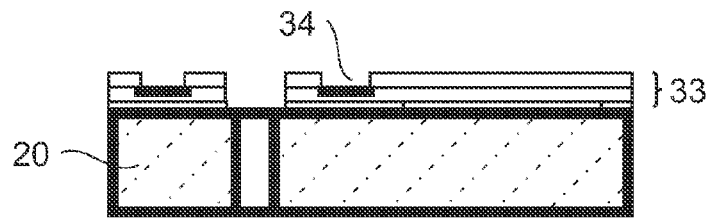
FIGS. 2a to 2p show process steps for attaching the flexible interconnection structure to a processed device in more detail, illustrating the fabrication of an optoelectronic device.
Figure 2L:
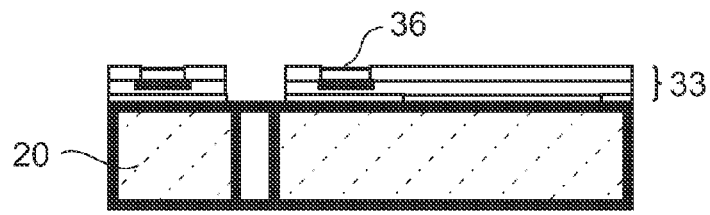
Figure 2M:
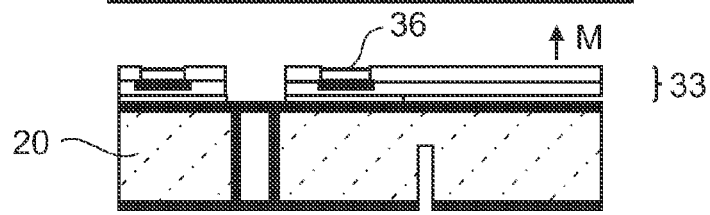
Figure 2N:
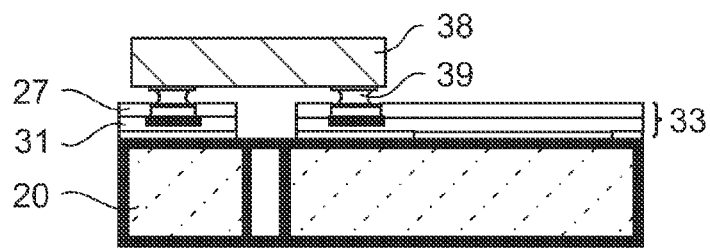
Figure 2O:
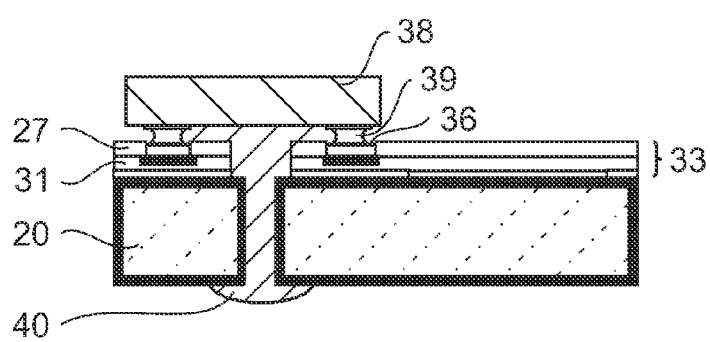
Figure 2P:
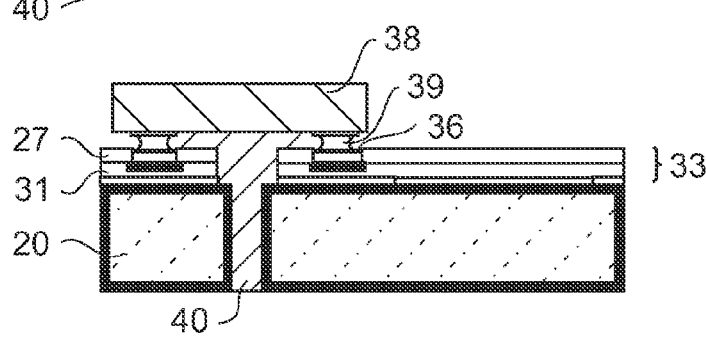

According to a further embodiment of the present invention, in FIGS. 2a to 2p, a process is illustrated for fabricating an electro-optical device which can be electrically driven by providing electrical signals via the flexible interconnection element to be attached thereon. With respect to the illustrated embodiment, the process steps for fabricating the flexible interconnection element 6 on the substrate surface are illustrated in more detail.

As shown in FIG. 2a, a first substrate 20 is structured to provide a through-hole 21 extending through the first substrate 20 from the upper surface 22 to a lower surface 23. The first substrate 20 may comprise any material, preferably and in this example silicon. The through-hole 21 also referred to as a via can e.g. be produced by drilling, deep-etching or the like. If the through-hole 21 is deep-etched, further trenches for breaking the first substrate 20 into several dices can be provided such that only one wafer-level-process step may be used, which facilitates manufacturing.

In a next step, as shown in the state of FIG. 2b, the silicon first substrate 20 is subjected to an oxidization process to provide a silicon dioxide layer 24 on the surfaces 22, 23 of the first substrate 20, thereby passivating the surface of the silicon first substrate 20. According to a preferred embodiment the thickness of the silicon dioxide layer 24 is between 1 and 10 µm, more preferably 5 µm. The through-hole 21 serves as a waveguide hole of the optoelectronic element to be built.

The next process state, as shown in FIG. 2c, shows a carrier substrate 25 separately provided, on which a sacrificial layer 26 is deposited. The carrier substrate 25 preferably comprises a transparent material such as glass or the like. If the thermal expansion coefficient is substantially equal to that of the silicon first substrate 20, in a following step of bonding a better alignment of the flexible interconnection element to the first substrate 20 can be achieved.

The sacrificial layer 26 comprises a polymer material, such as polyimide which is sensitive to radiation of a predetermined wavelength, such as UV light. On the sacrificial layer 26, a first layer 27 of a flexible material, e.g. BCB, is deposited.

As shown in the drawings of FIGS. 2d and 2e, in the next step a metal layer 28, preferably including copper, aluminium or the like, is deposited, e.g. by evaporating, sputtering, plating, from which signal lines are to be formed. Thereafter a masking pattern 29, e.g. of silicon oxide is applied to select the regions in which the signal lines shall be located within the flexible interconnection element.

In FIG. 2e, the result of an etch process is shown wherein the masking pattern 29 and the metal layer 28 in a region which was not covered by the masking pattern 29 are removed such that a metal region 30, also referred to as interconnection element, remains on the first layer 27 which defines the signal lines in the flexible interconnection element to be formed.

Thereafter, a second layer 31 of a flexible material is applied to the surface so that the signal lines are encapsulated by the first and second layers 27, 31 of the flexible material. The material of the second layer 31 can be the same as the material of the first layer 27, i.e. e.g. BCB, or can be a material different therefrom but is selected to provide a flexibility for the flexible interconnection element. The result of this process step is shown in FIG. 2f.

The steps of FIG. 2d to 2f can be repeated once or a plurality of times to provide a flexible structure having more than one interconnection element therein, i.e. providing and structuring a further metal layer and applying a third layer thereon.

In FIG. 2g, a process state is shown after selectively applying a bonding material 32 to the upper surface of the second layer 31. The bonding material 32 forming the bonding layer is only applied in a region in which an attachment of the flexible interconnection element and the first substrate 20 is to be obtained. In regions in which the flexible interconnection element should be movable and able to be bent away from the surface of the first substrate 20, no bonding material 32 is applied. Patterning of the bonding layer 32 can be performed using standard technology steps comprising etching and masking as known from the conventional silicon technology.

As shown in the process state of FIG. 2h, on the carrier substrate 25 the flexible interconnection element 33, also referred to as a flexible structure 33, is attached. The carrier substrate 25 and the first substrate 20 are adjoined so that the bonding material 32 comes into contact with the upper surface of the silicon dioxide layer 24 of the first substrate 20. The bonding is performed by melting the bonding layer 32, using a heating process which is performed at such predetermined temperatures that no other material used in the previous processes is affected in such a way that the final function of the device substantially deteriorates.

After finishing the bonding process, the sacrificial layer 26 is dissolved as shown in the process state of FIG. 2i. This can be carried out by applying a radiation having a wavelength to which the material of the sacrificial layer 26 is sensitive. Furthermore, the material of the carrier substrate 25 is selected so that it is substantially transparent for the wavelength of the radiation. In the given material, polyimide is preferably used as the material for the sacrificial layer 26, absorbing UV light so that the sacrificial layer 26 can be heated by directing UV light to it. The carrier substrate 25 should then be substantially transparent for UV light. After destroying, i.e. degrading, the sacrificial layer 26, the carrier substrate 25 can be removed which results in the process state shown in FIG. 2j.

As shown in the process state of FIG. 2k, the flexible interconnection element 33 is removed in a portion above the through-hole in the first substrate 20 by means of a further masking and etching process to form an aperture. Preferably by means of the same masking and etching process, the second layer 31 of the flexible material is etched in contact regions 34 to provide cavities in the second layer 31 and to uncover the signal lines 30 in the contact region 34 for a successive provision of contact pads.

As a next step shown in FIG. 2l, the cavities in the second layer 31 of the flexible material are filled with a conductive material such as Ni, Au etc., preferably using electroless plating on the signal lines in order to produce contact pads 36, also referred to as contact elements.

In the next step, a result of which is shown in the process state of FIG. 2m, the devices fabricated on the first substrate 20 are separated so that a part of the flexible interconnection element 33 has a released end and can be bent away from the surface of the first substrate 20 which is illustrated by the movement indicated by the arrow M.

For completion of the electrooptical device, an optoelectronic element 38 is soldered on the contact pads 36 by means of solder deposits 39, e.g. in the form of domes, columns or spherical balls, so that the optoelectronic element 38 is in electrical contact with the signal line in the flexible interconnection element 33. The optoelectronic element 38 comprises at least one of a laser diode, a photodetector or the like. The optoelectronic element 38 is aligned on the device shown in FIG. 2n so that its optically active or sensitive area is situated above the through-hole 21 such that in case of the optoelectronic element 38 including a laser diode, a laser beam is emitted through the through-hole 21 and in case of the optoelectronic element 38 including a photodiode, a light beam directed through the through-hole 21 can be received. The optoelectronic element 38 can be bonded to the contact pads 36 by means of a flip-chip bonding technique which is well-known in the art.

As illustrated in FIG. 2o, the through-hole 21 and the cavity formed by the first substrate 20, the flexible interconnection element 33 and the optoelectronic element 38 are filled with an optical polymer 40, also referred to as transparent filling material. The polymer 40 is cured to provide firstly a waveguide for a light beam sent or received by the optoelectronic element 38, and secondly a mechanical support for the electrooptical device 38 on the first substrate 20 after curing the optical polymer. As an optional last step to complete the electrooptical device, the backside of the first substrate 20 is polished so as to provide a plane coupling area for coupling light into the optical polymer 40 or out of it. Hence the filling material 40 is filled in such a way that the surface of the first substrate 20 opposite to the surface on which the flexible structure 33 is arranged, and the filling material 40 in the via 21 together form a common plane.

Figure 3:
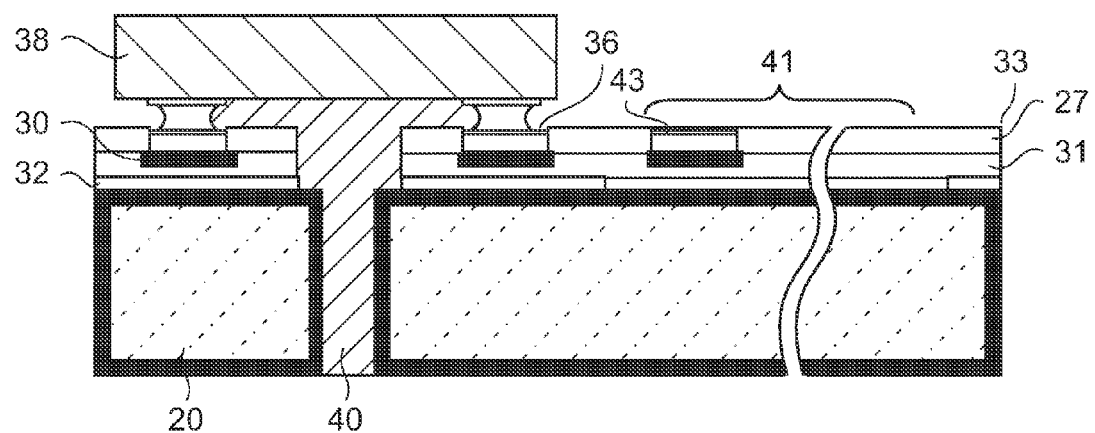
FIG. 3 is a cross-sectional view of the optoelectronic element fabricated by the process steps of FIGS. 2a to 2o.

The result of the method producing an electro-optical device is shown in FIG. 3. The step of producing the contact pads 36 can also be performed in a further region 41 of the flexible interconnection element 33 to allow the connecting of a further integrated device, e.g. containing an integrated circuit for driving or amplifying signals directed to the optoelectronic element 38 or received from it.

Figure 4:
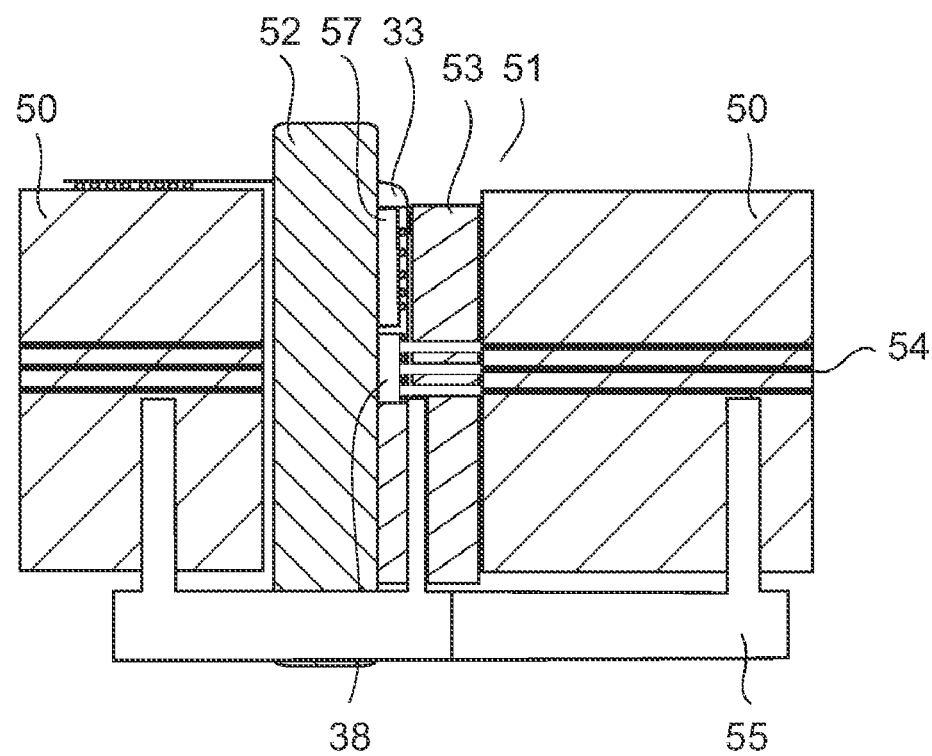
FIG. 4 shows the integration of the optoelectronic element of FIG. 3 in a printed circuit board.

In FIG. 4, the application of an electrooptical device as shown in FIG. 3 is illustrated. The application of FIG. 4 comprises a printed circuit board 50 which has a recess 51 in which the heat sink 52 and the electrooptical device 53 are arranged. Within the printed circuit board 50, three, or any other number than three, layers of optical guides 54 are included wherein the optical guides 54 end at the sidewalls of the recess 51.

The heat sink 52 is attached to the electrooptical device 53 wherein the optoelectronic element 38 is in contact with the heat sink 52 so that a thermal conductivity between the optoelectronic element 38 and the heat sink 52 is held on the printed circuit board 50. The electrooptical device 53 is arranged in the recess 51 of the printed circuit board 50, so that the openings of the through-hole (in the shown example, three through-holes are provided) are placed in a manner that they are in contact with the ends of the optical guides 54 included in the printed circuit board 50.

As described with regard to the electro-optical device shown in FIG. 3, (but not shown in detail in FIG. 4) a number of further contact pads 43 is provided in a region 41 on the flexible interconnection element 33 such that a driver or an amplifier device 57 may be connected to the further contact pads 43 to contact the signal lines in the flexible interconnection element 33 such that the optoelectronic element 38 can be driven or signals therefrom amplified.

The flexible interconnection element 33 has a length extending from the electrooptical device such that it can be led to a surface of the printed circuit board 50. On the surface of the printed circuit board 50, wiring and contact regions of the printed circuit board 50 are here provided which are connected to the signal lines in the flexible interconnection element 33 by soldering to solder contacts or another suitable interconnection process. Via the wiring on the printed circuit board 50, the optoelectronic element 38 of the electrooptical device can be electrically connected so that the electrooptical device can be operated by the signals provided via the wiring on the printed circuit board 50.

Figure 5:
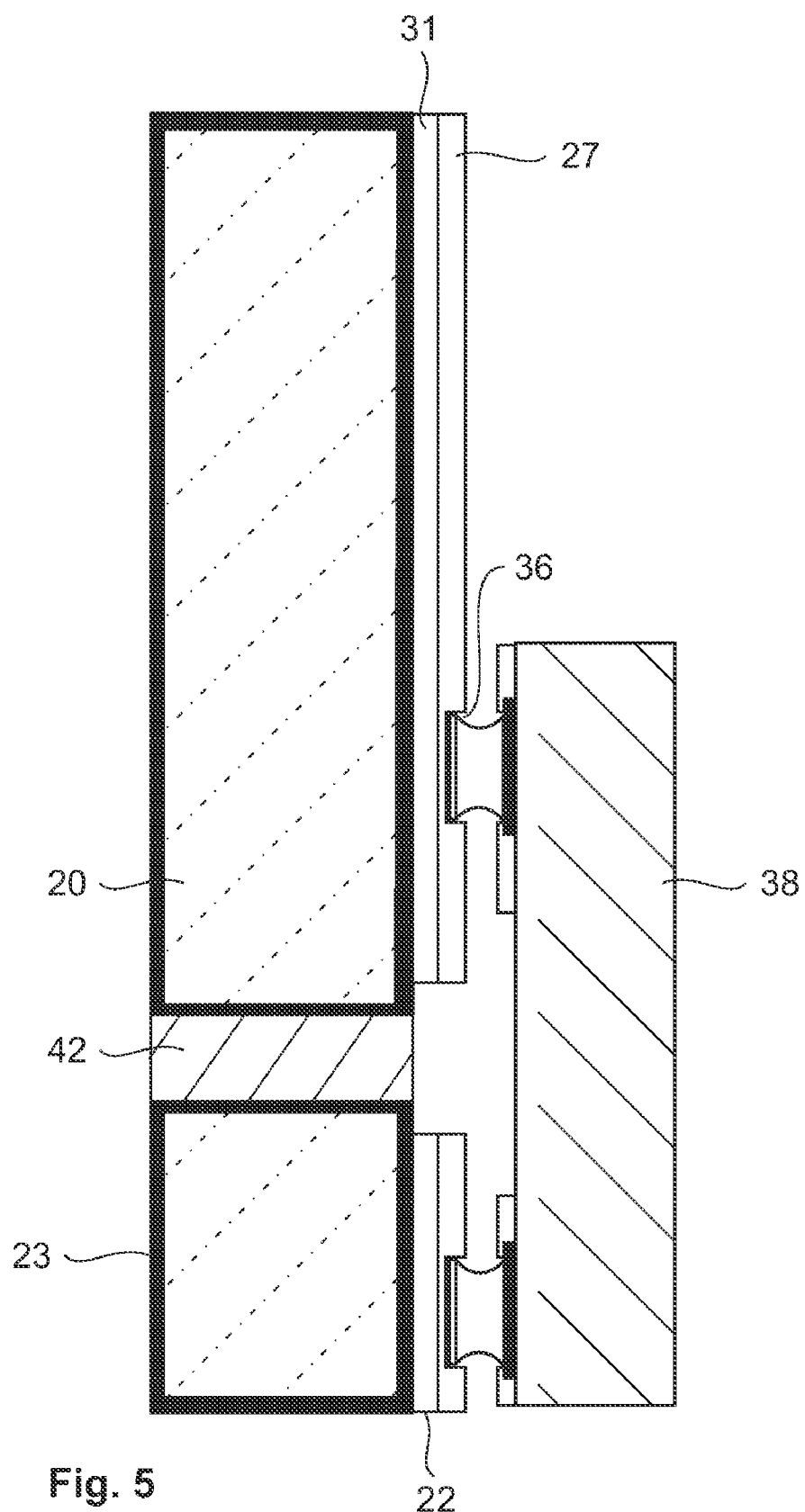
FIG. 5 shows an optoelectronic element wherein a throughhole is filled with an optical polymer.

Instead of filling the through-hole 21 of the first substrate 20 with an optical polymer 40 after attaching the optoelectronic element 38 to the flexible interconnection element 33 as shown with the process state of FIG. 2o, in an alternative embodiment an optical polymer 42 can be provided in the through-hole 21 of the first substrate 20 after the oxidization of the silicon first substrate 20. In such a way, the optical polymer 42 is provided before applying the flexible interconnection element 33 on the device and before soldering the optoelectronic element 38 to the flexible interconnection element 33. Providing the first substrate 20 with the optical polymer 42 is substantially performed in the same manner as illustrated with regard to FIG. 2o. The result is an electrooptical device as illustrated in FIG. 5. The difference between the embodiment of FIG. 5 and the embodiment of FIG. 3 lies in that the space between the upper surface of the first substrate 20 and the optoelectronic element 38 is not filled with the optical polymer 40. Instead, with regard to the embodiment of FIG. 5, the through-hole 21 is filled with the optical polymer 42 so that the ends of the through-hole 21 are in one plane with the main surfaces 22, 23 of the first substrate 20. This allows for light to be coupled into the optical polymer 42 in the through-hole 21 with a reduced loss due to dispersion of the light which would result in a reduced efficiency of a light-detecting or light-emitting element integrated in the optoelectronic element 38.

An optical board-to-backplane connector is described with regard to FIGS. 6a to 6e, 7, and 8 as another embodiment of the present invention. The optical signals are transmitted and detected on board level. Several boards are usually connected with a backplane that serves as a passive interconnection platform between the boards. Thus, an optical board-to-backplane connector element is used to provide the optical interconnection.

According to a further embodiment of the present invention, a method for producing such a connector element using the basic method as explained with regard to FIG. 1 is illustrated. As previously described with regard to the above-mentioned embodiments, a silicon wafer substrate 80 as first substrate 80 is provided which is used to provide the device bodies of the connector elements to be produced. As shown in FIG. 6b, the first substrate 80 is structured such that a number of device bodies 81 and 82 also referred to as a first area and a second area of the first substrate 80 are defined. Each of the device bodies 81, 82 is provided with one or more grooves 83 in which alignment pins can be engaged. The grooves 83 and the alignment pins are species of alignment elements engaging to perform alignment. The grooves 83 are preferably etched by means of known etching processes, e.g. an anisotropic wet etching process. Furthermore, between the areas for the device bodies 81, 82, slit openings 84, also referred to as spacing regions, are provided in which the material of the first substrate 80 is removed so that the device bodies 81, 82 are separated by the slit openings 84. The width of the slit openings 84 defines the length of the flexible interconnection between the device bodies 81, 82 which later form the connector elements.

Figure 6A:
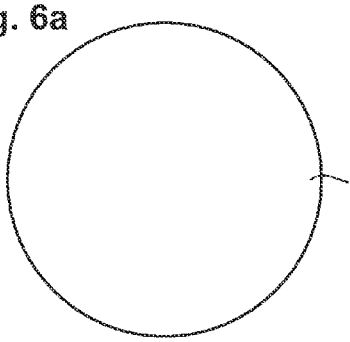
FIGS. 6a to 6e show process steps of a process for fabricating a connector element having at least two plugs.
Figure 6C:
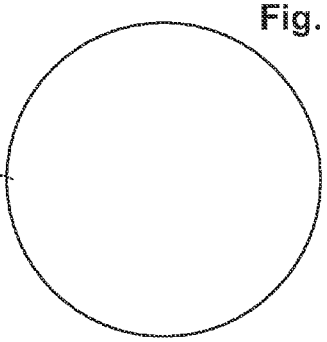
Figure 6B:
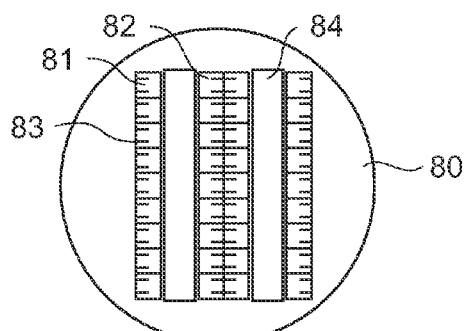
Figure 6D:
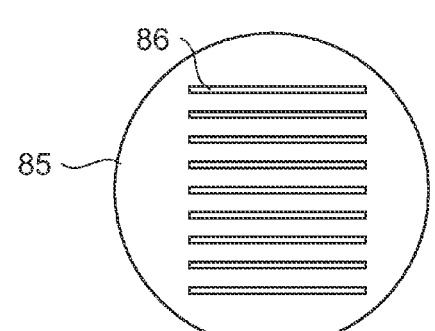

To provide the flexible interconnection elements 86, also referred to as a flexible structure, a glass second substrate 85, as shown in FIG. 6c, is provided on which the flexible interconnection elements 86 as described with regard to FIG. 2b to 2g are deposited. This process state is shown in FIG. 6d. Instead of electrical signal lines, in this embodiment optical signal lines are provided which may be fabricated in the same manner as the electrical signal lines by selecting an optical guide material instead of a conducting material for the signal lines.

Figure 6E:
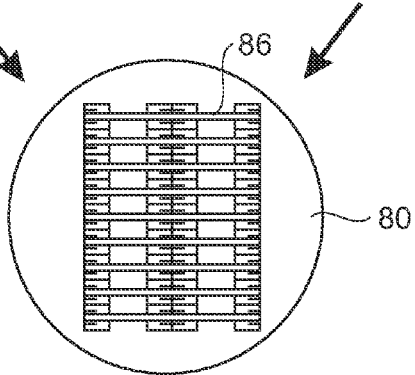

In a following process step, the structured first substrate 80 of FIG. 6b and the flexible interconnection elements 86 applied on the second substrate 85, as shown in FIG. 6d, are adjoined so that the flexible interconnection elements 86 are applied to the first substrate 80 aligned with the connector elements and particularly with the alignment grooves 83 in the device bodies 81, 82 (FIG. 6e).

The adjoining is performed in the same manner as described before with regard to FIG. 1e. Instead of providing grooves 83 in the device bodies 81, 82, other structures such as protruding structures can be deposited prior to or after bonding of the first substrate 80 and the second substrate 85. After lifting off of the second substrate 85, alignment elements, e.g. in the form of alignment pins, also referred to as guide pins, are arranged in the alignment grooves 83 and an encapsulation layer 87 is deposited on the surface of the so-processed first substrate 80. In an optional embodiment, the slit openings 84 can also be provided after joining the substrates 80, 85 instead of providing them before joining as described with regard to FIG. 6b.

Figure 7:
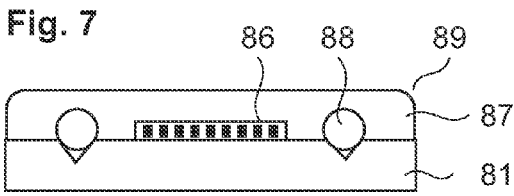
FIG. 7 shows a front view of one of the plugs of the connector element fabricated according to the process illustrated in FIG. 6.

Thereafter, the device bodies 81, 82 are separated by means of an etching or dicing process so that connector elements are produced having two plugs 89 which are interconnected by means of the flexible interconnection element 86. The front view of such a plug 89 is depicted in FIG. 7. The flexible interconnection element 86 is embedded in a common structure formed by the device bodies 81, 82 and the encapsulation layer 87. The alignment pins 88 protrude, thereby allowing an alignment of the plug 89 to a respective interface.

The bonding of the second substrate 85 to the first substrate 80 is performed in the area of the device bodies 81, 82 only, wherein the bonding polymer is previously removed through a patterning process between the device bodies 81, 82.

Figure 8:
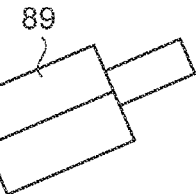
FIG. 8 shows a side view of the connector element fabricated by the process illustrated in FIGS. 6A to 6E.

In FIG. 8, a side view of such a connector element is illustrated including the protruding alignment pins 88. The front surface shown in FIG. 7 is plane, so that the flexible interconnection element 86 has its end in one plane with the front surfaces of the device bodies 81, 82 and the encapsulation layer 87. The optical signal lines (not shown) provided in the flexible interconnection element 86 can thereby be connected if the front surface of the connector element abuts a respective surface in which optical guides are included.

Figure 9:
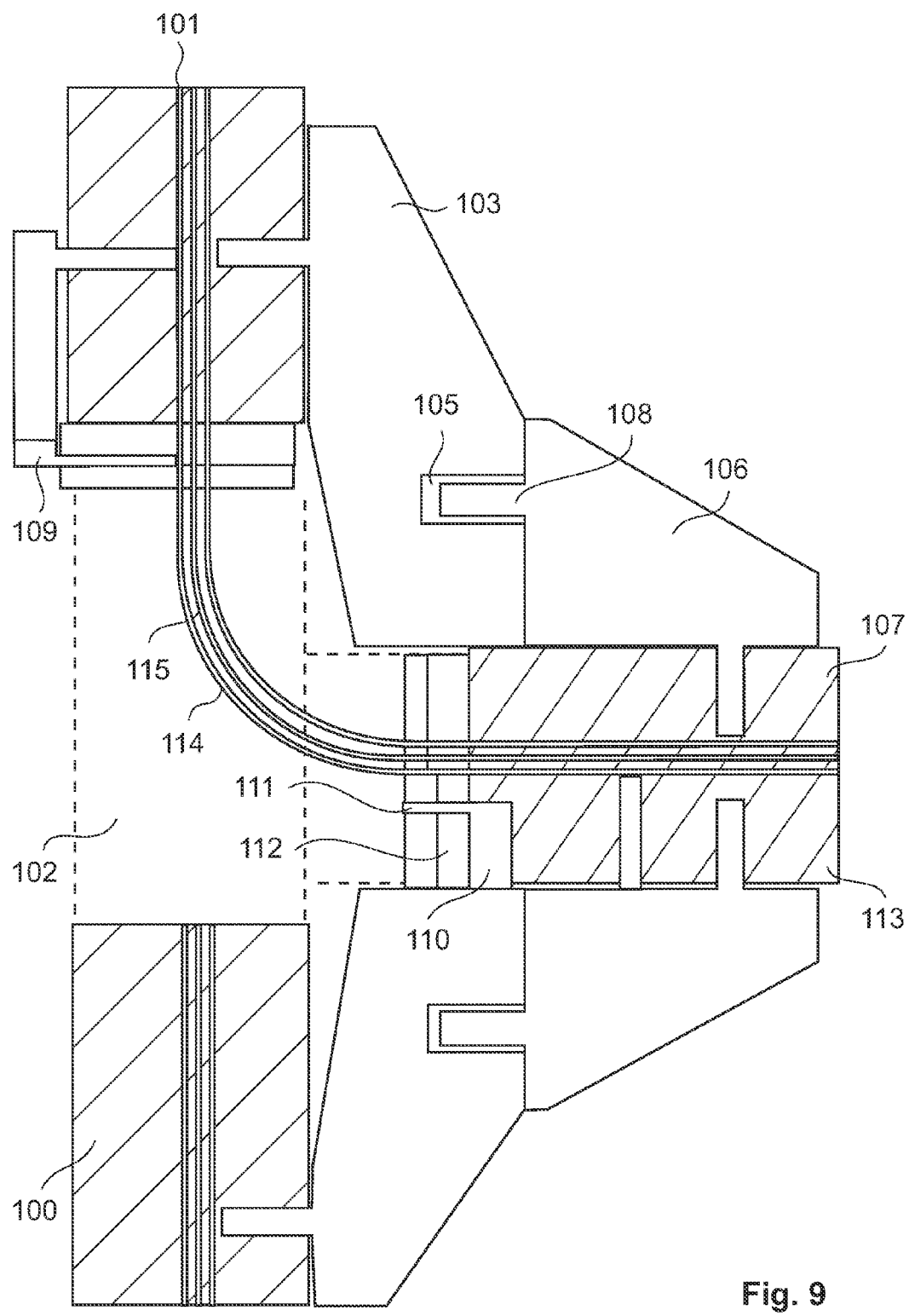
FIG. 9 shows the application of such a connector element for optically coupling optical guides between a backplane and a printed circuit board.

Such a connector element can be applied in a board-to-backplane arrangement which is illustrated in FIG. 9. FIG. 9 shows a backplane 100 which includes optical guide lines 101 which end in the sidewall of a recess 102. On the backplane 100, a first alignment element 103 is attached which includes a first engagement means 105. A second alignment element 106 is provided which is coupled to a printed circuit board 107 to be connected with the optical guide lines 101 in the backplane 100. The second alignment element 106 comprises second engagement means 108 which are adapted to engage with the first engagement means 105 so as to provide a mechanical support between the backplane 100 and the printed circuit board 107.

The backplane 100 as well as the printed circuit board 107 are provided with a receptacle element 109, 110 which is adapted to engage with a respective recess 111 in the plugs 112 of the connector element, as substantially illustrated with regard to FIGS. 6 to 8. The receptacle elements 109, 110 are arranged in such a way that optical guides in the printed circuit board 107 abut with their ends at the ends of the optical signal lines 115 provided in the plugs 112 of the flexible interconnection element 114.

Any of the described embodiments maybe combined in part or in total. The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having thus described the invention of the present application in detail and by reference to embodiments thereof, it will be apparent that modifications and variations are possible without departing from the scope of the invention defined in the appended claims.

The invention claimed is:

1. A method for producing a flexible structure attached to a device comprising:
    providing a first substrate;
    processing the first substrate by forming a via through the first substrate;
    providing a second substrate, the second substrate having a thermal expansion coefficient which is substantially equal to a thermal expansion coefficient of the first substrate;
    providing alignment elements on the first and second substrate for aligning the first substrate and second substrate relatively to each other;
    providing a flexible structure releasably attached to the second substrate, wherein the flexible structure includes an interconnection element which is an electrically conducting element and is at least one of an optical, a mechanical and an electrical interconnection element, wherein the flexible structure is patterned to uncover the interconnection element at least in a contact region, wherein the contact region is filled with a conducting material to provide a contact element on the flexible structure, and wherein providing the flexible structure comprises providing a first flexible layer on the second substrate, providing the interconnection element on the first flexible layer, and providing a second flexible layer to cover the first flexible layer and the interconnection element, wherein at least one of the materials of the first layer and the second layer is selected from a group consisting of a BCB polymer, polyimide and liquid crystal polymer;
    providing a sacrificial layer between the second substrate and the flexible structure, wherein the sacrificial layer is adapted such that the flexible structure is released from the second substrate by applying light through the second substrate to the sacrificial layer;
    providing a bonding layer on at least one of the first substrate and the flexible structure, wherein the bonding layer is structured to define a first region and a second region, and wherein the bonding layer comprises a polymer having a lower glass transition temperature than each of the materials of the first substrate, the second substrate and the flexible structure;
    connecting an optoelectronic element to the interconnection element of the flexible structure by means of the contact element, wherein the optoelectronic element is arranged that either light is sent through the via, light is received through the via, or both;
    adjoining the first and second substrate such that the flexible structure is attached on the first substrate by means of the bonding layer; and detaching the second substrate by degrading the sacrificial layer such that the flexible structure remains on the first substrate, wherein the second substrate is removed in the second region such that the flexible structure extends beyond the remaining first region;

wherein the flexible structure is attached on the first substrate in the first region and the flexible structure is uncoupled from the first substrate in the second region;

wherein the second substrate is selected to be transparent for the wavelength of the light applied to release the second substrate;

wherein the bonding layer and the flexible structure each comprise an aperture and wherein the first and the second substrates are adjoined such that the aperture is aligned with the via in the second substrate; and wherein the via and the aperture are filled with a transparent filling material which gets into contact with the opto-electronic element, the filling material being filled in such a way that a surface of the first substrate opposite to the surface on which the flexible structure is arranged, and the filling material in the via together form a common plane.

* * * * *